(12) United States Patent
Chen

(10) Patent No.: US 10,784,230 B2
(45) Date of Patent: Sep. 22, 2020

(54) COMPARTMENT SHIELDING FOR WARPAGE IMPROVEMENT

(71) Applicant: Advanced Semiconductor Engineering, Inc., Kaohsiung (TW)

(72) Inventor: Jenchun Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 727 days.

(21) Appl. No.: 15/352,527

(22) Filed: Nov. 15, 2016

(65) Prior Publication Data

US 2018/0138148 A1    May 17, 2018

(51) Int. Cl.
| | |
|---|---|
| *H01L 25/065* | (2006.01) |
| *H01L 23/552* | (2006.01) |
| *H01L 25/10* | (2006.01) |
| *H01L 21/56* | (2006.01) |
| *H01L 23/31* | (2006.01) |

(52) U.S. Cl.
CPC .......... *H01L 25/0655* (2013.01); *H01L 21/56* (2013.01); *H01L 23/552* (2013.01); *H01L 25/105* (2013.01); *H01L 23/3121* (2013.01); *H01L 23/3135* (2013.01)

(58) Field of Classification Search
None
See application file for complete search history.

(56) References Cited

U.S. PATENT DOCUMENTS

| 8,093,691 | B1 | | 1/2012 | Fuentes et al. | |
|---|---|---|---|---|---|
| 8,247,889 | B2 | | 8/2012 | Liao et al. | |
| 8,897,019 | B1 | * | 11/2014 | Shimamura | H01L 23/3121 361/728 |
| 9,653,407 | B2 | * | 5/2017 | Chen | H01L 23/552 |
| 9,935,083 | B2 | * | 4/2018 | Lee | H01L 25/0657 |
| 10,068,854 | B2 | * | 9/2018 | Lee | H01L 23/3121 |
| 2017/0005042 | A1 | * | 1/2017 | Chen | H01L 23/552 |
| 2017/0141081 | A1 | * | 5/2017 | Lee | H01L 25/0657 |
| 2017/0148744 | A1 | * | 5/2017 | Carson | H01L 23/552 |
| 2018/0114757 | A1 | * | 4/2018 | Lee | H01L 23/3121 |

* cited by examiner

*Primary Examiner* — Telly D Green
(74) *Attorney, Agent, or Firm* — Foley & Lardner LLP

(57) ABSTRACT

A semiconductor device package comprises a substrate, a first component, a second component, a package body and a conductive material. The substrate has a surface. The first component is on the surface of the substrate. The second component is on the surface of the substrate. The package body comprises a first portion, a second portion and a third portion. The first portion encapsulates the first component and has a side surface. The second portion encapsulates the second component and has a side surface. The third portion connects the first portion and the second portion and has a top surface. The side surface of the first portion, the side surface of the second portion and the top surface of the third portion define a space separating the side surface of the first portion from the side surface of the second portion. The conductive material is disposed in the space.

18 Claims, 20 Drawing Sheets

COMPARTMENT SHIELDING FOR WARPAGE IMPROVEMENT

BACKGROUND

1. Technical Field

The present disclosure relates generally to compartment shielding. More particularly, the present disclosure relates to compartment shielding for warpage improvement of a semiconductor device package.

2. Description of the Related Art

There is a continued demand for miniaturization, weight reduction, improved performance, improved reliability and lower cost in electronic products, and particularly so for mobile phones and wearable electronics.

Electromagnetic (EM) radiation can prevent a device from functioning correctly. This is called electromagnetic interference (EMI). Compartment shielding for a printed circuit boards (PCB) is developed to shield a part of the PCB from electromagnetic radiation at a source, rather than shielding all components or an entire housing/enclosure of a device against EMI.

SUMMARY

In some embodiments, a semiconductor device package comprises a substrate, a first component, a second component, a package body and a conductive material. The substrate has a surface. The first component is on the surface of the substrate. The second component is on the surface of the substrate. The package body comprises a first portion, a second portion and a third portion. The first portion encapsulates the first component and has a side surface. The second portion encapsulates the second component and has a side surface. The third portion connects the first portion and the second portion and has a top surface. The side surface of the first portion, the side surface of the second portion and the top surface of the third portion define a space separating the side surface of the first portion from the side surface of the second portion. The conductive material is disposed in the space.

In some embodiments, a semiconductor device package comprises a substrate, a first package body, a second package body, a third package body and a conductive material. The substrate has a surface. The first package body covers a first portion of the surface of the substrate. The second package body covers a second portion of the surface of the substrate. The first package body and the second package body define a trench separating the first package body from the second package body. The third package body is between the trench and the surface of the substrate. The conductive material is disposed in the trench. The third package body connects the first package body to the second package body.

In some embodiments, a method of manufacturing a semiconductor device package comprises providing a substrate having a surface; disposing a first component and a second component on the surface of the substrate; forming a package body encapsulating the first component, the second component and the surface of the substrate; removing a portion of the package body to form a trench between the first component and the second component and retaining another portion of the package body under the trench; and filling a conductive material into the trench.

In some embodiments, a method of manufacturing a semiconductor device package comprises providing a substrate having a surface; disposing a first component and a second component on the surface of the substrate; forming a first package body encapsulating the first component, the second component and the surface of the substrate; forming a patterned conductive layer on the first package body; forming a second package body encapsulating the first package body and the patterned conductive layer; removing a portion of the second package body and the first package body to form a trench exposing the patterned conductive layer and the surface of the substrate; and filling a conductive material into the trench.

Figure 1:
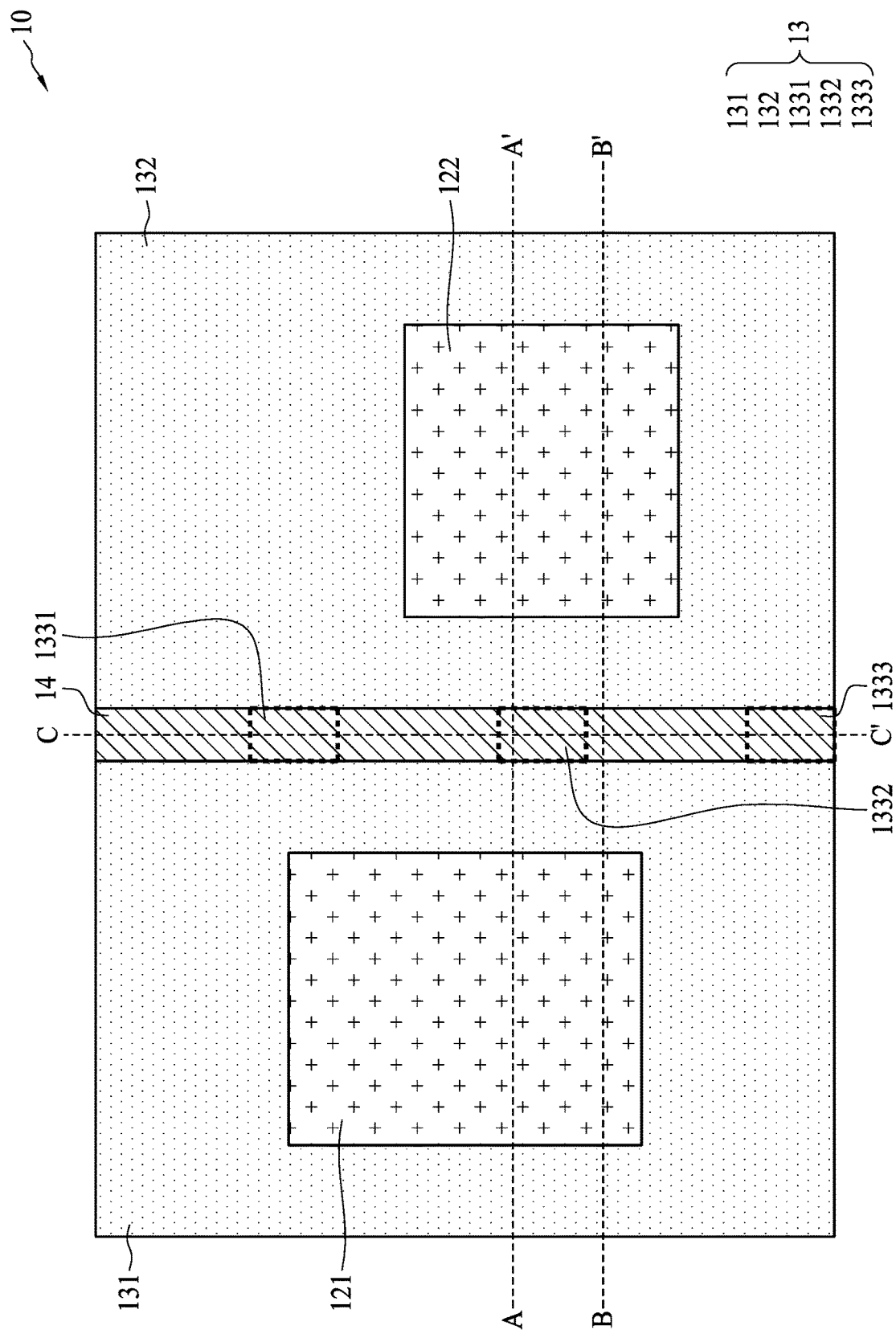
FIG. 1 illustrates a top view of a semiconductor device package in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

An EMI compartment shield may be formed by filling a conductive adhesive into a trench/groove extending from a top surface of a package body to a bottom surface of the package body. The EMI compartment shield is provided in a package to protect devices or components from EMI arising from other devices (e.g., radio frequency integrated circuits or other components operating at a relatively high frequency). However, such structure may lead to damage of a package substrate during a packaging process; for example, the package substrate may be vulnerable when undergoing thermal cycling, which may result in warpage of the package substrate, and a portion of the package substrate may crack, leading to delamination of the package body.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

As used herein, the term "warpage" refers to deformation of a structure of a substrate which reduces a planarity of one or more surfaces of the substrate. Magnitude of the warpage may be determined by a distance between a lowest point of the deformation of the substrate to a highest point of the deformation. Each substrate may have a different degree of warpage resulting from a change from room temperature (e.g., about 25° C.) to a reflow temperature (e.g., about 260° C.), or from the reflow temperature to room temperature. Further, warpage may occur while a semiconductor substrate stays at a steady temperature, due to a mismatch in the coefficient of thermal expansion (CTE) between different components of the substrate. In other words, two sides of the substrate may be subject to different degrees of thermal expansion, resulting in stress effects that cause warpage. Additionally, as an overall thickness of a semiconductor structure decreases, warpage in the semiconductor structure may be more pronounced. Therefore, a solution for preventing warpage would be beneficial to the semiconductor industry.

Figure 2:
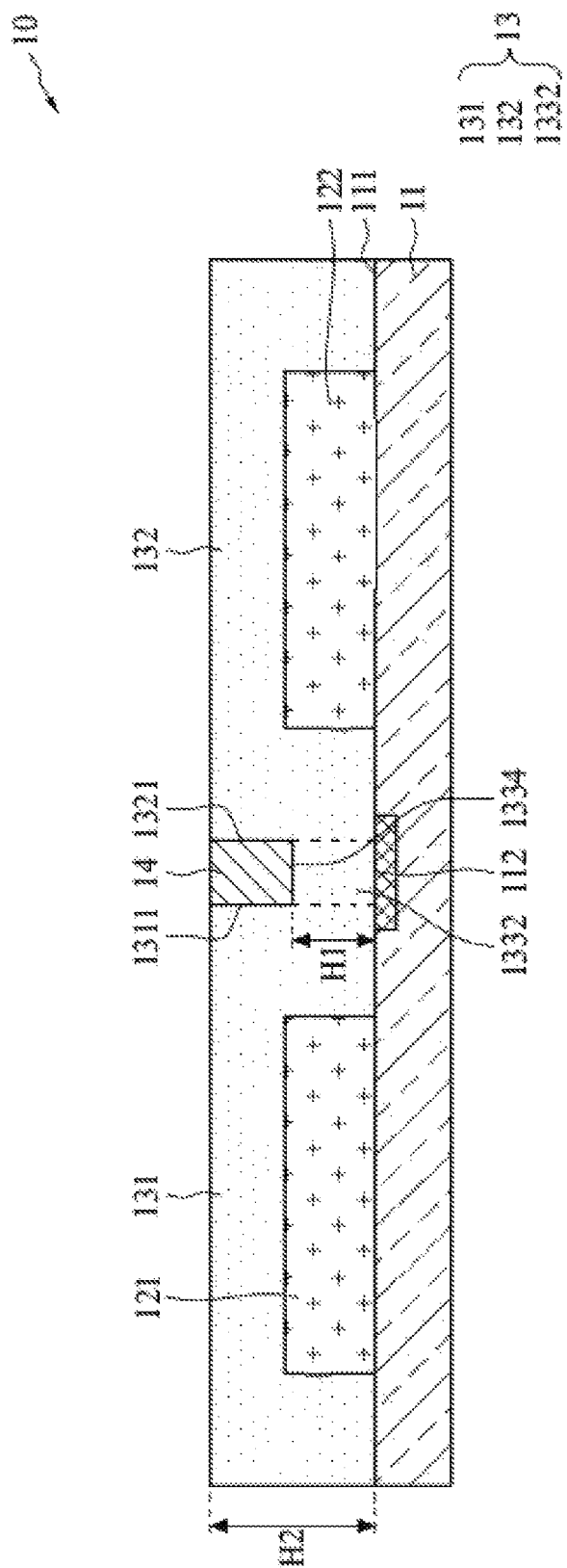
FIG. 2 illustrates a cross-sectional view of the semiconductor device package shown in FIG. 1.
Figure 3:
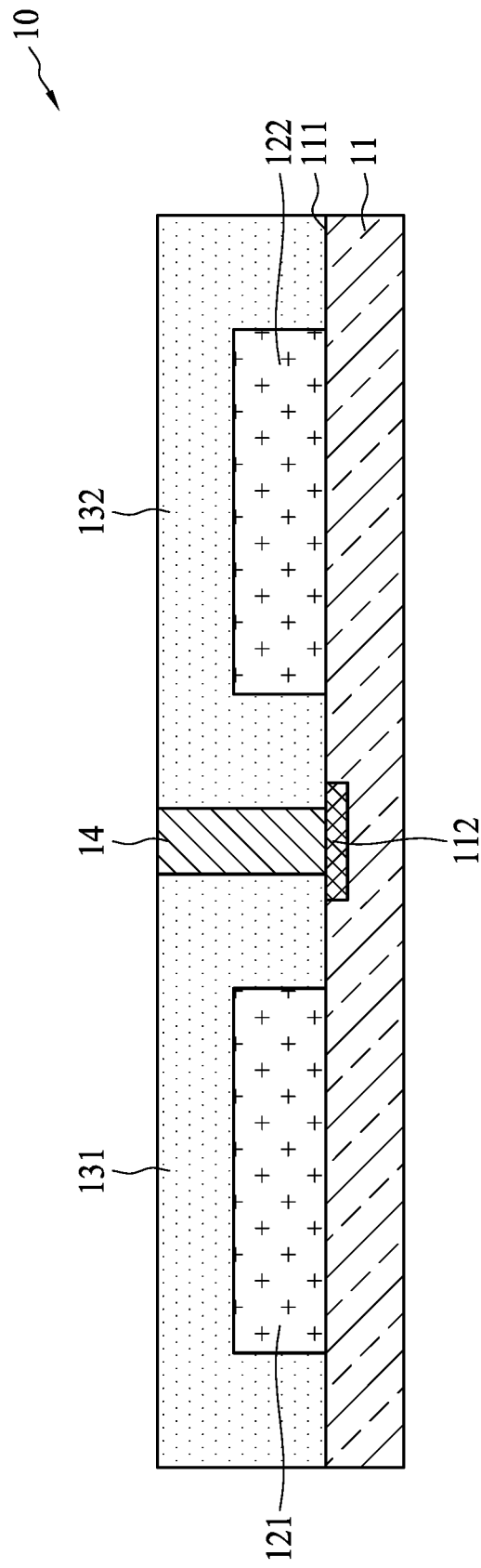
FIG. 3 illustrates another cross-sectional view of the semiconductor device package shown in FIG. 1.
Figure 4:
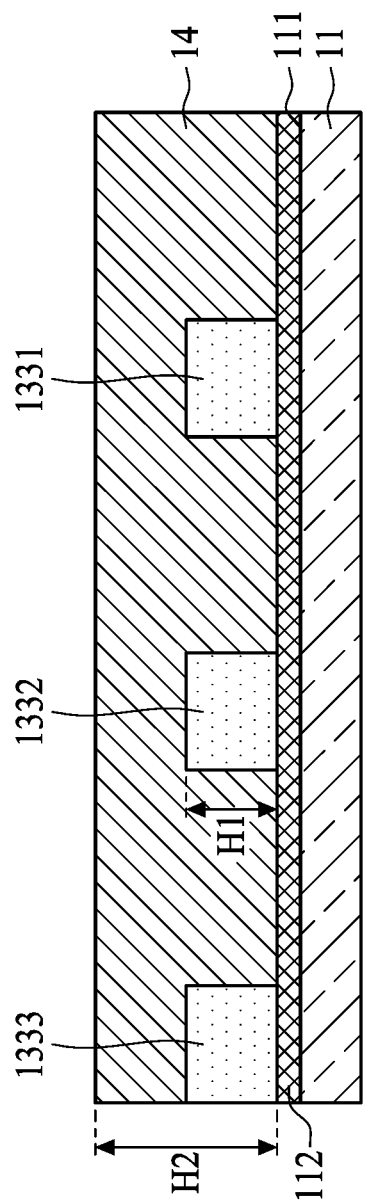
FIG. 4 illustrates another cross-sectional view of the semiconductor device package shown in FIG. 1.

FIG. 1 illustrates a top view of a semiconductor device package 10 in accordance with some embodiments of the present disclosure. FIG. 2 illustrates a cross-sectional view of the semiconductor device package 10 across line AA' of FIG. 1. FIG. 3 illustrates a cross-sectional view of the semiconductor device package 10 across line BB' of FIG. 1. FIG. 4 illustrates a cross-sectional view of the semiconductor device package 10 across line CC' of FIG. 1. Referring to FIGS. 1-4, the semiconductor device package 10 comprises a substrate 11, a first electronic component 121, a second electronic component 122, a package body 13 and a conductive material (a material filled into a space 14). The space 14 also may be referred to as a trench.

The substrate 11 may be, or may include, a polymeric or a non-polymeric dielectric material. For example, the substrate 11 may include a flowable dielectric material in a hardened or semi-hardened state, such as a liquid crystal polymer, a resin with pre-impregnated fibers (e.g., a prepreg), Ajinomoto Buildup Film (ABF), a resin, an epoxy material, or other flowable dielectric material in a hardened or semi-hardened state. In some embodiments, the substrate 11 includes a single resin layer. In other embodiments, the substrate 11 includes multiple resin layers; for example, a first sub-layer formed of a resin and a second sub-layer formed of an enhanced resin (such as a resin enhanced by glass fibers or Kevlar fibers). In some embodiments, the substrate 11 includes a prepreg that may be in a single layer or multiple layers. In some embodiments, the substrate 11 includes at least one prepreg layer and at least one resin layer.

The substrate 11 has a surface (e.g., a top surface) 111. The first component 121 is on the surface 111 of the substrate 11. The second component 122 is on the surface 111 of the substrate 11. The package body 13 comprises a first portion 131, a second portion 132 and a third portion 1332. The first portion 131, the second portion 132 and the third portion 1332 also may be referred to as a first package body, a second package body and a third package body, respectively. The first portion 131, the second portion 132 and the third portion 1332 may be integrally formed with one another as a monolithic structure. The first portion 131 encapsulates the first component 121 and has a first surface (e.g., a side surface) 1311. The second portion 132 encapsulates the second component 122 and has a first surface (e.g., a side surface) 1321. The third portion 1332 connects the first portion 131 and the second portion 132 and has a first surface (e.g., a top surface) 1334. The first surface 1311 of the first portion 131, the first surface 1321 of the second portion 132 and the first surface 1334 of the third portion 1332 define the space 14 separating the first surface 1311 of the first portion 131 from the first surface 1321 of the second portion 132. The conductive material is disposed in the space 14. As shown in FIGS. 1 and 4, the semiconductor device package 10 further comprises portions 1331 and 1333 connecting the first portion 131 and the second portion 132 and are similar to the third portion 1332. By connecting the first portion 131 and the second portion 132 with the portions 1331, 1332 and 1333, continuity and rigidity of the package body 13 are improved so that damage of the semiconductor device package 10 during a packaging process is prevented. For example, warpage of the semiconductor device package 10 may otherwise result in cracking of the conductive material or cracking of an interface between the conductive material and the package body 13. The cracking may result in damage of the semiconductor device package 10. In some embodiments, the portion 1333 of the package body 13 is adjacent to a periphery of the substrate 11 as shown in FIG. 4. In some embodiments, all portions of the package body 13 for connecting the first portion 131 and the second portion 132 are formed adjacent to the periphery of the substrate 11 so that a substantially complete EMI compartment shield can be formed at a center of the semiconductor device package 10 to improve EMI shielding effects. Retains the portions 1331, 1332 and 1333 of the package body 13 in the space 14 may also lower a cost for manufacturing the semiconductor device package 10 since a cost of the conductive material filled into the space 14 may be much higher than a cost of a molding compound for forming the package body 13.

In some embodiments, the substrate 11 further comprises a grounding layer 112 therein. The conductive material is electrically connected to the grounding layer 112. As shown in FIGS. 2 and 4, in some embodiments, the third portion 1332 of the package body 13 has a height H1 which ranges from about 30% to about 90% of a height H2 of the package body 13 at the first portion 131 or the second portion 132. The conductive material in the space 14 forms an EMI compartment shield. The EMI compartment shield can isolate the first component 121 and the second component 122 from each other and from other components, and allows the components 121 and 122 to have low EMI and high electromagnetic compatibility (EMC). Also, the components 121 and 122 with various functions can be integrated into the semiconductor device package 10 to reduce a number of components in an electronic product so as to decrease a size of the product.

Figure 5:
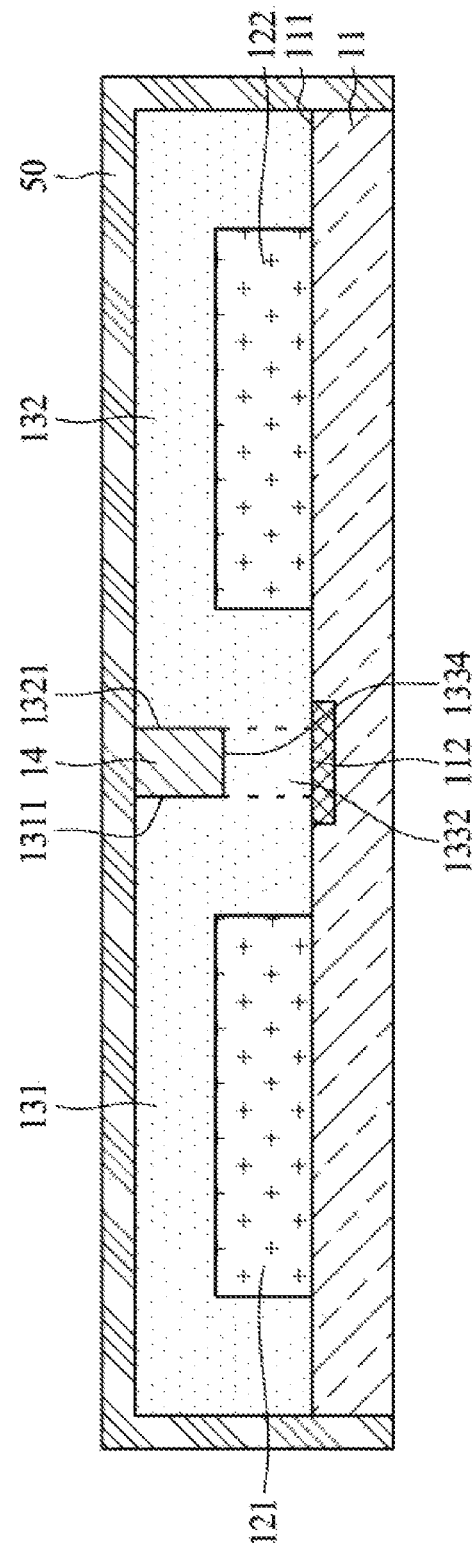
FIG. 5 illustrates a cross-sectional view of a semiconductor device package in accordance with some embodiments of the present disclosure.

FIG. 5 illustrates a cross-sectional view of a semiconductor device package in accordance with some embodiments of the present disclosure. A conformal shield 50 is formed for covering the package body 13, the conductive material in the space 14 and a side surface of the substrate 11, and the conformal shield 50 is electrically connected to the grounding layer 112 and the conductive material in the space 14. In some embodiments, the conductive material in the space 14 and the conformal shield 50 are not formed by a plating method at a same time or in a same operation. In some embodiments, the conformal shield 50 is formed by a sputtering method, and a thickness of the conformal shield 50 is about 1 µm to about 2 µm. A material of the conformal shield 50 is or includes, for example, nickel (Ni). In some embodiments, the conformal shield 50 may be formed by a plating method, and the material of the conformal shield 50 may be, or may include, copper (Cu). Furthermore, the sputtering method can be used to form an anti-oxidation layer (not shown in the figures) for covering the conformal shield 50. For example, a thickness of the anti-oxidation layer is about 40 nm, and a material of the anti-oxidation layer is, or includes, stainless steel. The anti-oxidation layer can prevent oxidization of the conformal shield 50, thereby raising a yield rate of a product.

Figure 6:
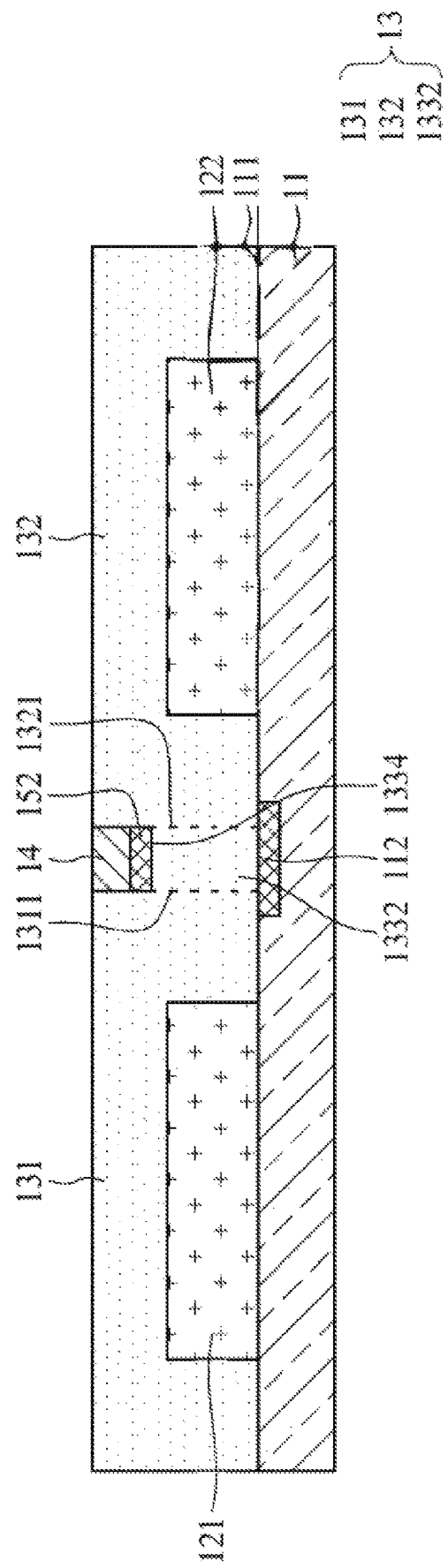
FIG. 6 illustrates a cross-sectional view of a semiconductor device package in accordance with some embodiments of the present disclosure.
Figure 7:
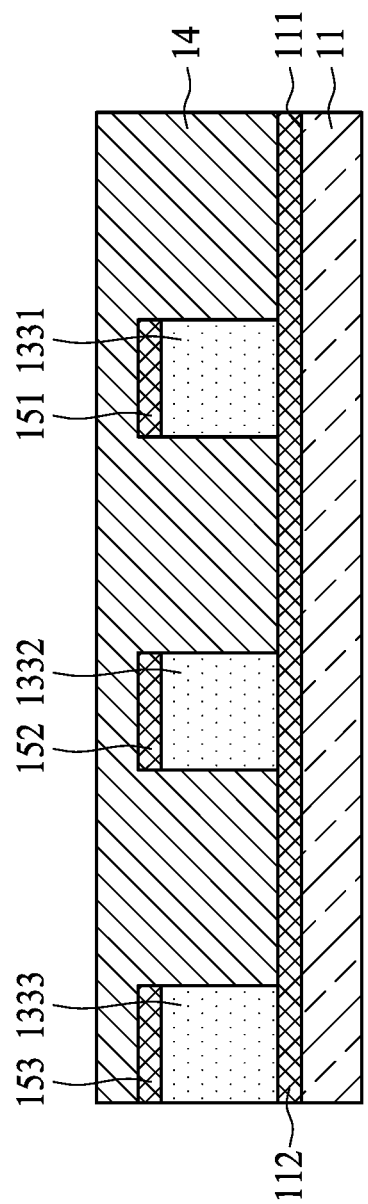
FIG. 7 illustrates another cross-sectional view of the semiconductor device package shown in FIG. 6.

FIG. 6 illustrates a cross-sectional view of a semiconductor device package in accordance with some embodiments of the present disclosure. FIG. 7 illustrates another cross-sectional view of the semiconductor device package shown in FIG. 6. Similarly to FIGS. 2 and 4, the semiconductor device package in FIGS. 6 and 7 comprises a substrate 11, a first component 121, a second component 122, a package body 13 and a conductive material (a material filled into a space 14). The substrate 11 has a surface 111. The first component 121 is on the surface 111 of the substrate 11. The second component 122 is on the surface 111 of the substrate 11. The package body 13 comprises a first portion 131, a second portion 132 and a third portion 1332. The first portion 131 encapsulates the first component 121 and has a first surface 1311. The second portion 132 encapsulates the second component 122 and has a first surface 1321. The third portion 1332 connects the first portion 131 and the second portion 132 and has a first surface 1334. The first surface 1311 of the first portion 131, the first surface 1321 of the second portion 132 and the first surface 1334 of the third portion 1332 define the space 14 separating the first surface 1311 of the first portion 131 from the first surface 1321 of the second portion 132. The conductive material is disposed in the space 14. Moreover, a conductive layer 151, 152 and 153 is formed on first surfaces of the portions 1331, 1332 and 1333 of the package body 13. In some embodiments, since the space 14 may be formed by removing a portion of the package body 13 (e.g., with cutting, laser drilling, etching or other removal process), the first surfaces of the portions 1331, 1332 and 1333 of the package body 13 may be rough. Therefore, when the conductive material is filled into the space 14, the rough first surfaces may otherwise result in voids between the conductive material and the first surfaces and may degrade EMI shielding effect of the EMI compartment shield. The voids can be prevented by forming the conductive layer 151, 152 and 153 on the first surfaces of the portions 1331, 1332 and 1333 of the package body 13.

Figure 8:
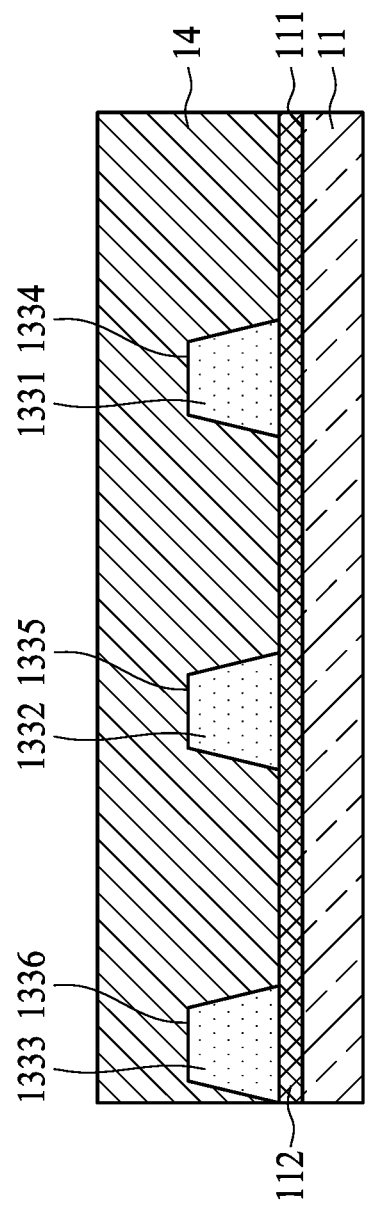
FIG. 8 illustrates a cross-sectional view of a semiconductor device package in accordance with some embodiments of the present disclosure.

FIG. 8 illustrates a cross-sectional view of a semiconductor device package in accordance with some embodiments of the present disclosure. Similarly to FIG. 4, a substrate 11 has a surface 111. In some embodiments, the substrate 11 further comprises a grounding layer 112 therein. A third portion 1332 of a package body has a first surface 1335 and is formed on the grounding layer 112. A conductive material is disposed in a space 14. The conductive material is electrically connected to the grounding layer 112. Portions 1331 and 1333 of the package body are also formed on the grounding layer 112 and are similar to the third portion 1332. In some embodiments, the portion 1333 is adjacent to a periphery of the substrate 11 as shown in FIG. 8. In some embodiments, the portions 1331, 1332 and 1333 of the package body are tapered in a direction from the surface 111 of the substrate 11 toward the first surfaces 1334, 1335 and 1336.

Figure 9:
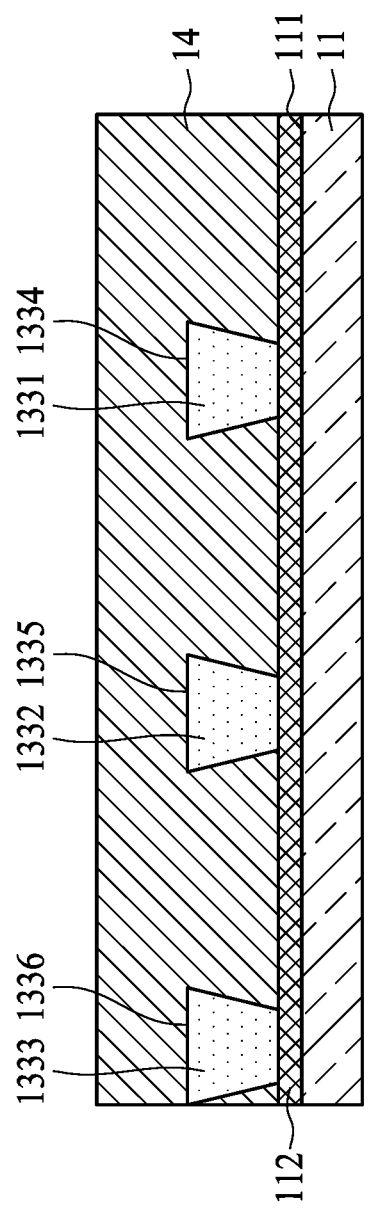
FIG. 9 illustrates a cross-sectional view of a semiconductor device package in accordance with some embodiments of the present disclosure.

FIG. 9 illustrates a cross-sectional view of a semiconductor device package in accordance with some embodiments of the present disclosure. Similarly to FIG. 4, a substrate 11 has a surface 111. In some embodiments, the substrate 11 further comprises a grounding layer 112 therein. A third portion 1332 of a package body has a first surface 1335 and is formed on the grounding layer 112. A conductive material is disposed in a space 14. The conductive material is electrically connected to the grounding layer 112. Portions 1331 and 1333 of the package body are also formed on the grounding layer 112 and are similar to the third portion 1332. In some embodiments, the portion 1333 is adjacent to a periphery of the substrate 11 as shown in FIG. 9. In some embodiments, the portions 1331, 1332 and 1333 of the package body are tapered in a direction from the first surfaces 1334, 1335 and 1336 thereof toward the surface 111 of the substrate 11. Since the portions 1331, 1332 and 1333 of the package body are tapered toward the surface 111 of the substrate 11, the conductive material in the space 14 can be locked with the package body and warpage of the package body may be further controlled.

Referring to FIGS. 4, 8 and 9, an area A1 (e.g., along the surface 111 of the substrate 11) of each of the portions 1331, 1332 and 1333 of the package body is smaller than about 0.5 mm$^2$ as an operating frequency of each of the first component 121 and the second component 122 is between about 700 MHz to about 10 GHz. In some embodiments, the area A1 of each of the portions 1331, 1332 and 1333 of the package body is smaller than about 0.3 mm$^2$ as the operating frequency of each of the first component 121 and the second component 122 is between about 10 GHz to about 30 GHz. A width or lateral dimension of each of the portions 1331, 1332 and 1333 of the package body in the space 14 for EMI shielding is desirably less than about one-fourth to about one-tenth of the operating frequency of the components 121 and 122. In some embodiments, the area of each of the portions 1331, 1332 and 1333 of the package body is smaller than about 0.4 mm$^2$ as the operating frequency of each of the first component 121 and the second component 122 is between about 100 MHz to about 10 GHz. In some embodiments, the area of each of the portions 1331, 1332 and 1333 of the package body is smaller than about 0.2 mm$^2$ as the operating frequency of each of the first component 121 and the second component 122 is between about 10 GHz to about 30 GHz.

Also referring to FIGS. 1-4, in some embodiments, the semiconductor device package 10 comprises the substrate 11, the first package body 131, the second package body 132, the trench 14, the third package body 1332 and the conductive material filled in the trench 14.

The substrate 11 has the surface 111. The first package body 131 covers a first portion of the surface 111 of the substrate 11. The second package body 132 covers a second portion of the surface 111 of the substrate 11. The trench 14 separates the first package body 131 from the second package body 132. The third package body 1332 is between the trench 14 and the surface 111 of the substrate 11. The conductive material is disposed in the trench 14. The third package body 1332 connects the first package body 131 to the second package body 132.

As shown in FIGS. 1 and 4, the semiconductor device package 10 further comprises package bodies 1331 and 1333 connecting the first package body 131 and the second package body 132 and are similar to the third package body 1332. In some embodiments, the package body 1333 is adjacent to the periphery of the substrate 11 as shown in FIG. 4.

In some embodiments, the substrate 11 further comprises the grounding layer 112 therein. The conductive material is electrically connected to the grounding layer 112. As shown in FIGS. 2 and 4, in some embodiments, the third package body 1332 has the height H1 which ranges from about 30% to about 90% of the height H2 of the first package body 131 or the second package body 132.

Also referring to FIGS. 6 and 7, the semiconductor device package comprises the substrate 11, the first package body 131, the second package body 132, the trench 14, the third package body 1332 and the conductive material filled in the trench 14. The substrate 11 has the surface 111. The first package body 131 covers a first portion of the surface 111 of the substrate 11. The second package body 132 covers a second portion of the surface 111 of the substrate 11. The trench 14 separates the first package body 131 from the second package body 132. The third package body 1332 is between the trench 14 and the surface 111 of the substrate 11. The conductive material is disposed in the trench 14. The third package body 1332 connects the first package body 131 to the second package body 132. Moreover, the conductive layer 151, 152 and 153 is formed on the package bodies 1331, 1332 and 1333.

Also referring to FIG. 8, the substrate 11 has the surface 111. In some embodiments, the substrate 11 further comprises the grounding layer 112 therein. The third package body 1332 has the first surface 1335 and is formed on the grounding layer 112. The conductive material is disposed in the trench 14. The conductive material is electrically connected to the grounding layer 112. The package bodies 1331 and 1333 are also formed on the grounding layer 112 and are similar to the third package body 1332. In some embodiments, the package body 1333 is adjacent to the periphery of the substrate 11 as shown in FIG. 8. In some embodiments, the package bodies 1331, 1332 and 1333 are tapered from the surface 111 of the substrate 11 toward the first surfaces 1334, 1335 and 1336.

Also referring to FIG. 9, the substrate 11 has the surface 111. In some embodiments, the substrate 11 further comprises the grounding layer 112 therein. The third package body 1332 has the first surface 1335 and is formed on the grounding layer 112. The conductive material is disposed in the trench 14. The conductive material is electrically connected to the grounding layer 112. The package bodies 1331 and 1333 are also formed on the grounding layer 112 and are similar to the third package body 1332. In some embodiments, the package body 1333 is adjacent to the periphery of the substrate 11 as shown in FIG. 9. In some embodiments, the package bodies 1331, 1332 and 1333 are tapered from the first surfaces 1334, 1335 and 1336 thereof toward the surface 111 of the substrate 11.

Also referring to FIGS. 4, 8 and 9, the area A1 of each of the package bodies 1331, 1332 and 1333 is smaller than about 0.5 mm$^2$ as the operating frequency of each of the first component 121 and the second component 122 is between about 700 MHz to about 10 GHz. In some embodiments, the area A1 of each of the package bodies 1331, 1332 and 1333 is smaller than about 0.3 mm$^2$ as the operating frequency of each of the first component 121 and the second component 122 is between about 10 GHz to about 30 GHz.

Figure 10A:
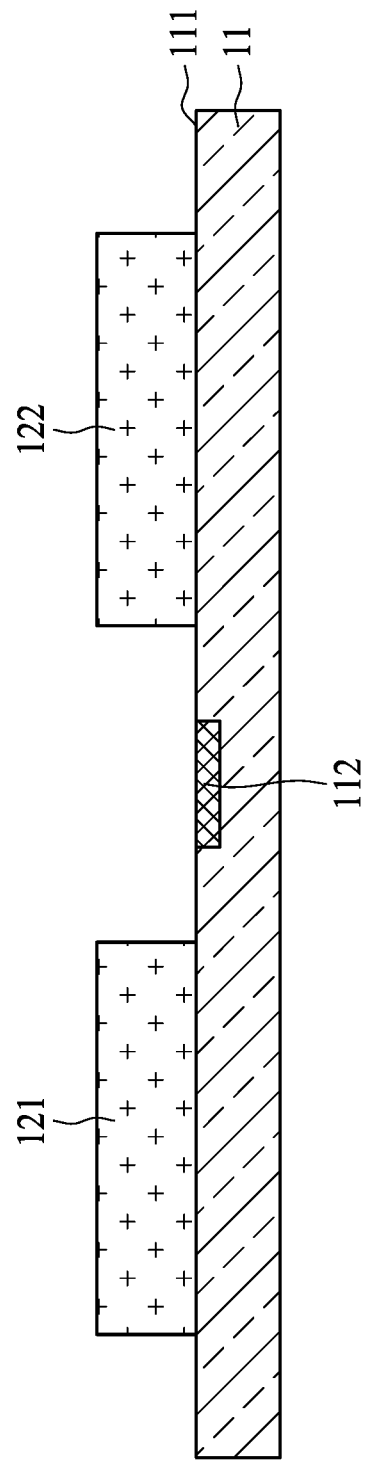
FIG. 10A, FIG. 10B and FIG. 10C illustrate a manufacturing method in accordance with some embodiments of the present disclosure.
Figure 10B:
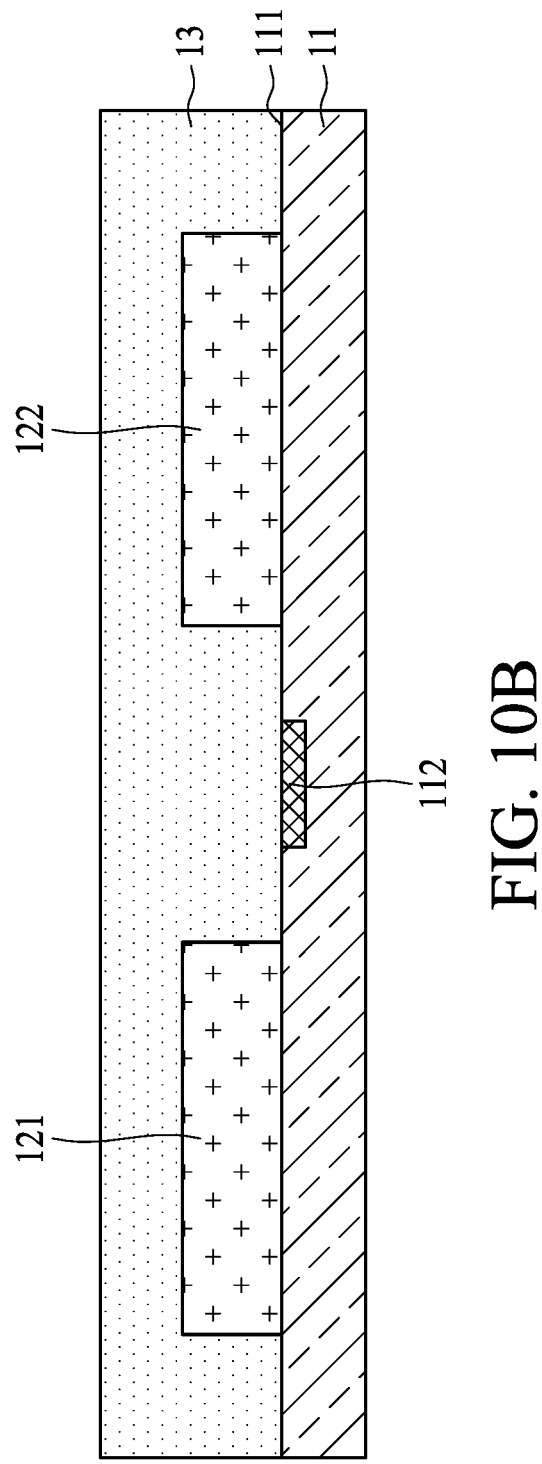
Figure 10C:
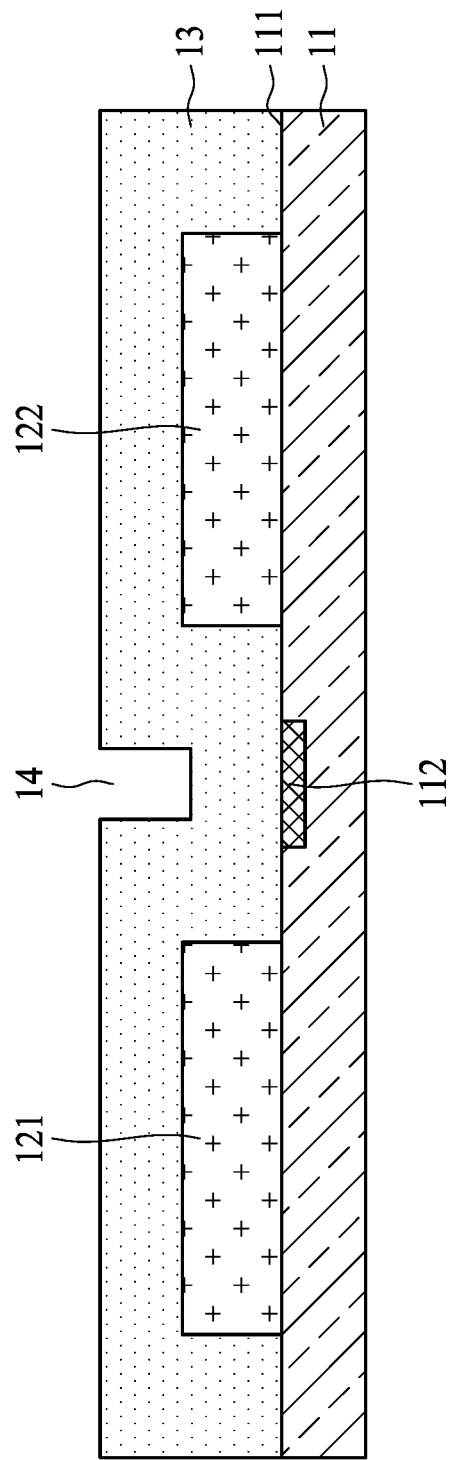

FIG. 10A, FIG. 10B and FIG. 10C illustrate a method of manufacturing a semiconductor device package in accordance with some embodiments of the present disclosure.

Referring to FIG. 10A, a substrate 11 having a surface 111 is provided. A first component 121 and a second component 122 are disposed on the surface 111 of the substrate 11. A grounding layer 112 is also formed in the substrate 11.

Referring to FIG. 10B, a molding compound is disposed to encapsulate the first component 121, the second component 122 and the surface 111 of the substrate 11 to form a package body 13.

Referring to FIG. 10C, a portion of the package body 13 is removed to form a trench 14 between the first component 121 and the second component 122. Another portion 1332 of the package body 13 is left under the trench 14 (see FIG. 2). In other words, the molding compound that forms the package body 13 is sectionally cut to from the trench 14, and some of the molding compound remains under the trench 14 so as to stabilize the structure of the package body 13 after being cut. A conductive material is filled into the trench 14 and is electrically connected to the grounding layer 112 so as to form an EMI compartment shield (as shown in FIGS. 1-4). The conductive material may be, or may include, a metal, a metal alloy, a conductive adhesive, or another suitable material. The method of FIGS. 10A-10C may be used to form the semiconductor device package 10 as shown in FIGS. 1-4.

FIG. 11A, FIG. 11B, FIG. 11C and FIG. 11D illustrate a method of manufacturing a semiconductor device package in accordance with some embodiments of the present disclosure.

Figure 11A:
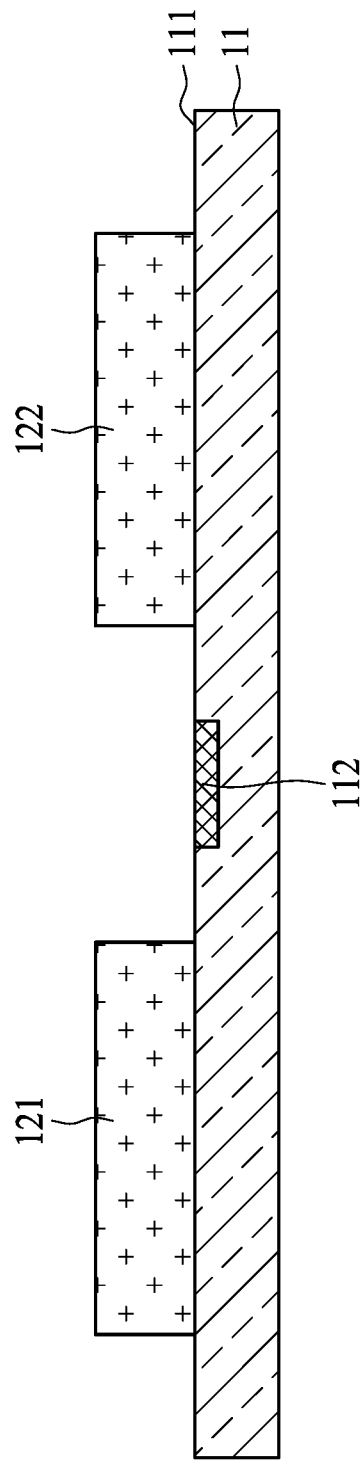
FIG. 11A, FIG. 11B, FIG. 11C and FIG. 11D illustrate a manufacturing method in accordance with some embodiments of the present disclosure.

Referring to FIG. 11A, a substrate 11 having a surface 111 is provided. A first component 121 and a second component 122 are disposed on the surface 111 of the substrate 11. A grounding layer 112 is also formed in the substrate 11.

Figure 11B:
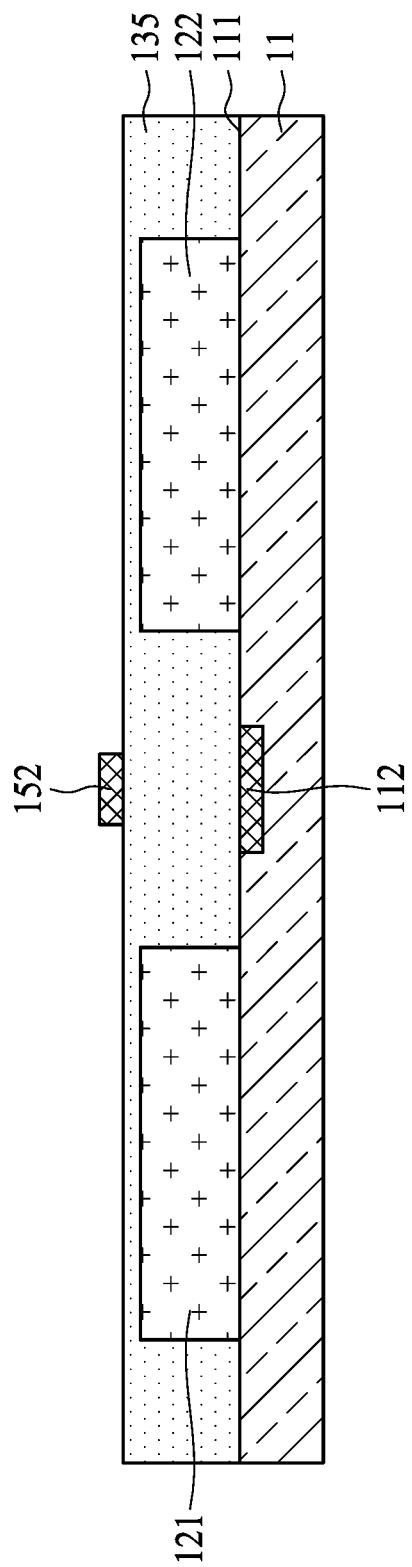

Referring to FIG. 11B, a molding compound is disposed to encapsulate the first component 121, the second component 122 and the surface 111 of the substrate 11 to form a first package body 135. A patterned conductive layer 152 is formed on the first package body 135.

Figure 11C:
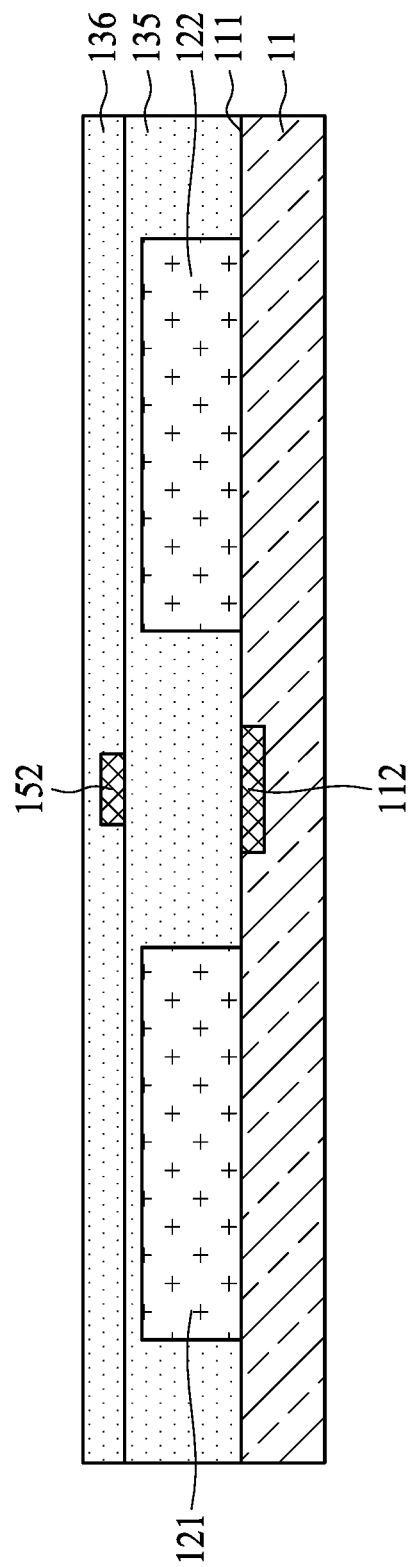

Referring to FIG. 11C, a molding compound is disposed to encapsulate the first package body 135 and the patterned conductive layer 152 to form a second package body 136.

Figure 11D:
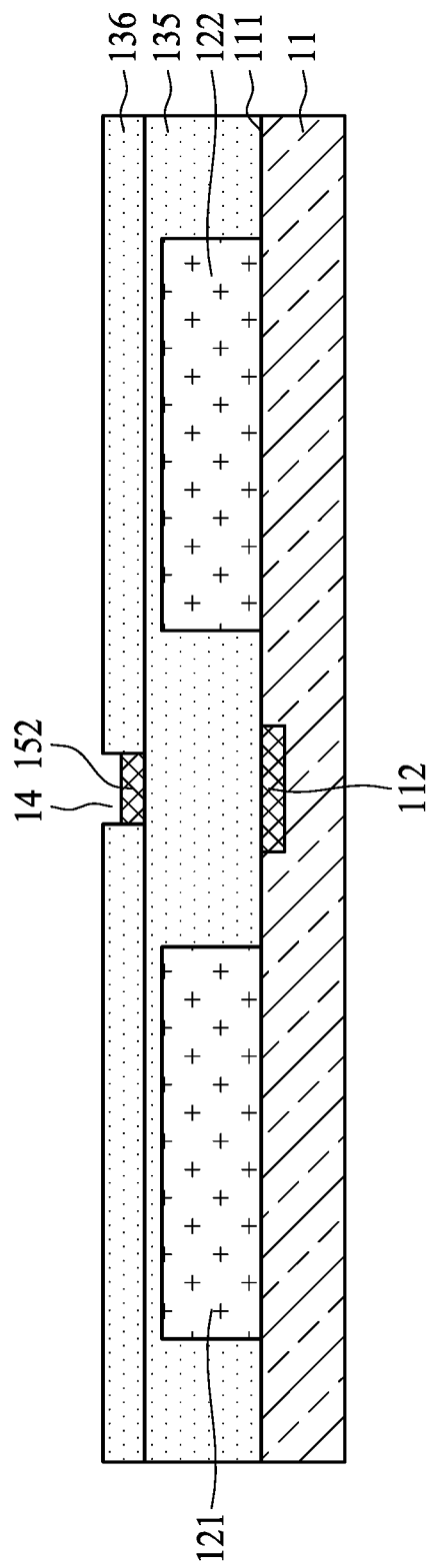

Referring to FIG. 11D, a portion of the first package body 135 and the second package body 136 are removed to form a trench 14 exposing the patterned conductive layer 152 and the grounding layer 112. A conductive material is filled into the trench 14 (as shown in FIG. 7). The method of FIG. 11A, FIG. 11B, FIG. 11C and FIG. 11D may be used to form the semiconductor device package as shown in FIGS. 6-7.

FIG. 12A, FIG. 12B, FIG. 12C and FIG. 12D illustrate a method of manufacturing a semiconductor device package in accordance with some embodiments of the present disclosure. The method illustrated in FIG. 12A, FIG. 12B, FIG. 12C and FIG. 12D is similar in certain aspects to the method illustrated in FIG. 11A, FIG. 11B, FIG. 11C and FIG. 11D and differ in that they are illustrated in a cross-sectional view from different directions.

Figure 12A:
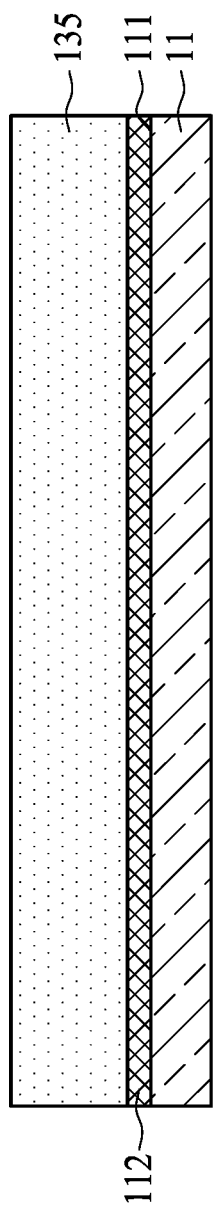
FIG. 12A, FIG. 12B, FIG. 12C and FIG. 12D illustrate a manufacturing method in accordance with some embodiments of the present disclosure.

Referring to FIG. 12A, a substrate 11 having a surface 111 is provided. A grounding layer 112 is also formed in the substrate 11.

Figure 12B:
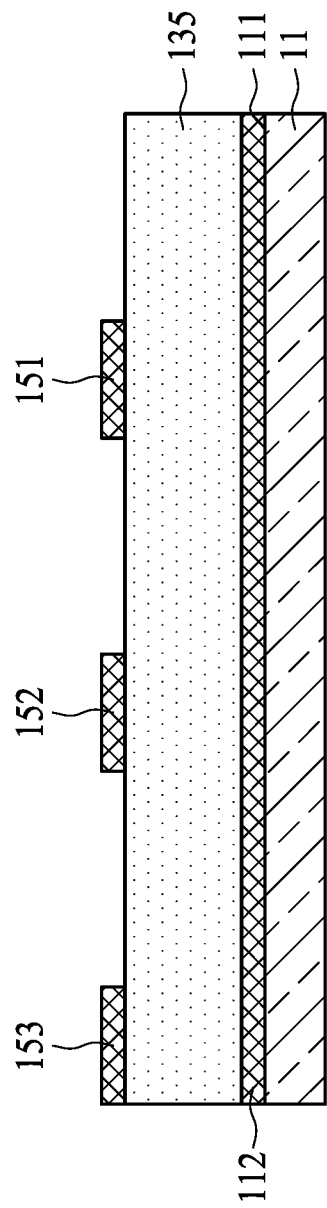

Referring to FIG. 12B, a molding compound is disposed to encapsulate the surface 111 of the substrate 11 to form a first package body 135. A patterned conductive layer 151, 152 and 153 is formed on the first package body 135.

Figure 12C:
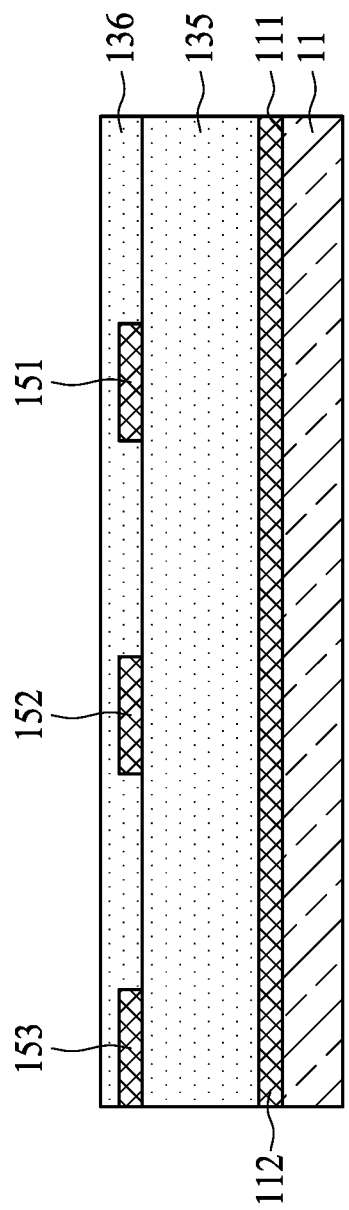

Referring to FIG. 12C, a molding compound is disposed to encapsulate the first package body 135 and the patterned conductive layer 151, 152 and 153 to form a second package body 136.

Figure 12D:
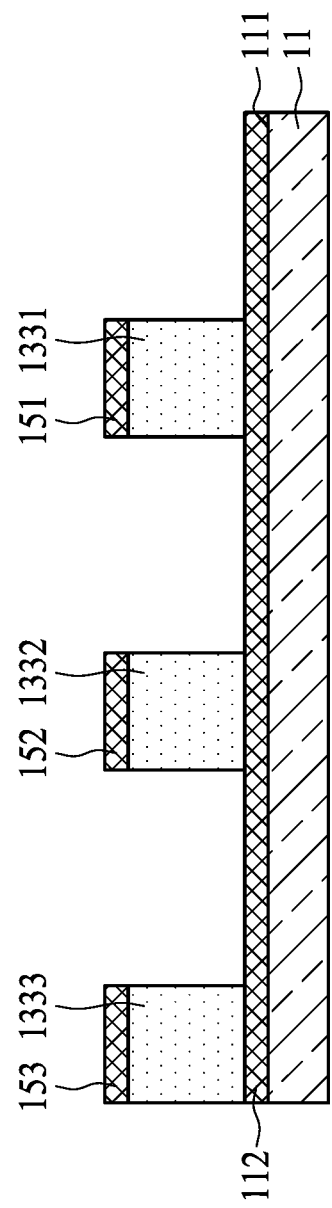

Referring to FIG. 12D, a portion of the first package body 135 and the second package body 136 are removed to form a trench exposing the patterned conductive layer 151, 152 and 153 and the grounding layer 112. A conductive material is filled into the trench. The patterned conductive layer 151, 152 and 153 is on top of each of portions 1331, 1332 and 1333 of a resulting package body. The method of FIG. 12A, FIG. 12B, FIG. 12C and FIG. 12D may be used to form the semiconductor device package as shown in FIGS. 6-7.

As used herein, the singular terms "a," "an," and "the" may include plural referents unless the context clearly dictates otherwise.

As used herein, the terms "connect," "connected," and "connection" refer to an operational coupling or linking. Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, a component provided "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The construction and arrangement of the packages and methods as shown in the various example embodiments are illustrative only. Accordingly, all such modifications are intended to be included within the scope of the present disclosure. The order or sequence of any process or method operations may be varied or re-sequenced according to alternative embodiments. Other substitutions, modifications, changes, and omissions may be made in the design, operating conditions and arrangement of the example embodiments without departing from the scope of the present disclosure.

What is claimed is:

1. A semiconductor device package, comprising:
   a substrate having a surface;
   a first component on the surface of the substrate;
   a second component on the surface of the substrate;
   a molding compound comprising
      a first portion encapsulating the first component and having a side surface,
      a second portion encapsulating the second component and having a side surface facing the side surface of the first portion, wherein the side surface of the first portion is separated from the side surface of the second portion, and
      a third portion connecting the first portion and the second portion and having a top surface; and
   a conductive material disposed between the side surface of the first portion and the side surface of the second portion, wherein a first portion of the conductive material is disposed on the top surface of the third portion and a second portion of the conductive material is directly disposed on a grounding layer of the surface of the substrate.

2. The semiconductor device package of claim 1, wherein the third portion of the molding compound has a height which ranges from about 30% to about 90% of a height of the molding compound at the first portion.

3. The semiconductor device package of claim 1, wherein the third portion of the molding compound is adjacent to a periphery of the substrate.

4. The semiconductor device package of claim 1, wherein an area of the third portion of the molding compound is smaller than about 0.5 mm$^2$.

5. The semiconductor device package of claim 1, wherein an area of the third portion of the molding compound is smaller than about 0.3 mm$^2$.

6. The semiconductor device package of claim 4, wherein an operating frequency of the semiconductor device package is between 700 MHz and 10 GHz.

7. The semiconductor device package of claim 5, wherein an operating frequency of the semiconductor device package is between 10 GHz and 30 GHz.

8. The semiconductor device package of claim 1, wherein the molding compound further comprises a fourth portion connecting the first portion and the second portion and having a top surface, wherein a third portion of the conductive material is disposed on the top surface of the fourth portion and a fourth portion of the conductive material is directly disposed on the grounding layer of the surface of the substrate.

9. The semiconductor device package of claim 8, wherein the third portion does not contact with the fourth portion.

10. A semiconductor device package, comprising:
a substrate having a surface;
a first molding compound covering a first portion of the surface of the substrate;
a second molding compound covering a second portion of the surface of the substrate, wherein the first molding compound and the second molding compound define a trench separating the first molding compound from the second molding compound;
a third molding compound between the first molding compound and the second molding compound and on the surface of the substrate; and
a conductive material disposed in the trench, wherein a portion of the conductive material is disposed on the top surface of the third molding compound and another portion of the conductive material is directly disposed on a grounding layer of the surface of the substrate,
wherein the third molding compound connects the first molding compound to the second molding compound.

11. The semiconductor device package of claim 10, wherein the third molding compound has a height which ranges from about 30% to about 90% of a height of the first molding compound.

12. The semiconductor device package of claim 10, wherein the third molding compound is adjacent to a periphery of the substrate.

13. The semiconductor device package of claim 10, wherein an area of the third molding compound is smaller than about 0.5 mm$^2$.

14. The semiconductor device package of claim 10, wherein an area of the third molding compound is smaller than about 0.3 mm$^2$.

15. The semiconductor device package of claim 13, wherein an operating frequency of the semiconductor device package is between 700 MHz and 10 GHz.

16. The semiconductor device package of claim 14, wherein an operating frequency of the semiconductor device package is between 10 GHz and 30 GHz.

17. The semiconductor device package of claim 10, further comprising a fourth molding compound between the first molding compound and the second molding compound and directly on the grounding layer of the surface of the substrate, wherein the fourth molding compound connects the first molding compound to the second molding compound.

18. The semiconductor device package of claim 17, wherein the third molding compound does not contact with the fourth molding compound.

* * * * *